(12) United States Patent
Nuber et al.

(10) Patent No.: US 6,775,116 B2
(45) Date of Patent: Aug. 10, 2004

(54) METHOD AND APPARATUS FOR PREVENTING BUFFERS FROM BEING DAMAGED BY ELECTRICAL CHARGES COLLECTED ON LINES CONNECTED TO THE BUFFERS

(75) Inventors: Paul D Nuber, Ft Collins, CO (US); Gayvin E Stong, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 242 days.

(21) Appl. No.: 10/046,103

(22) Filed: Nov. 1, 2001

(65) Prior Publication Data

US 2003/0081361 A1 May 1, 2003

(51) Int. Cl.[7] .................................................. H02H 9/00
(52) U.S. Cl. ........................ 361/54; 361/111; 361/91.5
(58) Field of Search .............................. 361/54, 91.1–5, 361/111, 56, 91.5, 93.2; 257/355, 173, 199; 438/237

(56) References Cited

U.S. PATENT DOCUMENTS

| | | | | |
|---|---|---|---|---|
| 5,426,322 A | * | 6/1995 | Shiota | 257/355 |
| 5,910,730 A | * | 6/1999 | Sigal | 326/24 |
| 5,969,929 A | * | 10/1999 | Kleveland et al. | 361/111 |
| 6,628,556 B2 | * | 9/2003 | Huber | 365/194 |

* cited by examiner

Primary Examiner—Gregory J. Toatley, Jr.
Assistant Examiner—Boris Benenson

(57) ABSTRACT

An apparatus and method are provided for preventing buffers used to reduce delays on long lines of an IC from being damaged due to charge that collects on the buffers during manufacturing. In accordance with the present invention, a protection diode is included directly in at least each buffer that is used for this purpose, i.e., for the purpose of preventing delays on long lines of the IC. By including a protection diode in at least each buffer that is used for this purpose, the present invention obviates the need for having to use tools during the IC design process to determine a suitable location for a protection diode.

19 Claims, 2 Drawing Sheets

US 6,775,116 B2

METHOD AND APPARATUS FOR PREVENTING BUFFERS FROM BEING DAMAGED BY ELECTRICAL CHARGES COLLECTED ON LINES CONNECTED TO THE BUFFERS

TECHNICAL FIELD OF THE INVENTION

The present invention relates to integrated circuits (ICs) and, more particularly, to a solution that prevents electrical charge that collects on long signal lines that are interrupted by buffers, or repeaters, in an IC from damaging the transistors of the buffers.

BACKGROUND OF THE INVENTION

In ICs, very long conductive signal lines are sometimes needed to connect certain drivers to certain receivers in the IC. Signals propagating along these long lines are delayed due to the combination of the capacitance and resistance of the lines. It is known to insert buffers, or repeaters, into the lines to reduce the signal delays. A buffer is a device on the IC comprised of field effect transistors (FETs) that are configured to drive the signal received by the buffer to reduce the delay. Generally, the delay increases in a non-linear fashion as the length of the line increases (i.e., the increase in delay is proportional to the length of the line squared). Therefore, the inclusion of buffers along long lines is relatively common in ICs manufactured using current IC manufacturing processes.

One of the problems associated with the use of buffers is that, when the lines are being put down during fabrication of the IC, electrical charge builds up on the lines. The process of putting lines down includes spraying charged metal ions onto the IC wafer. These charged ions collect on the gates of the transistors of the buffers and can punch holes in the gate oxide of the FETs, which damages the repeaters. One known solution to this problem is to fabricate diodes into the IC that are coupled to the lines at locations close to the buffers. The diode will pull enough of the charge off of the gate of the FET to prevent damage to the FET, and thus to the buffer.

Rule checker programs, which are used to check IC designs before the ICs are fabricated, are capable of determining whether a protection diode is needed in order to protect the buffer and, if so, the location at which the diode should be placed in the IC. One of the difficulties associated with using such tools to determine whether a diode is needed and, if so, where it is to be located, is that existing tools cannot always find a location for the protection diode. ICs typically have many blocks and layers, and there is not always a convenient location for the diode. Also, the diode should be close to the buffer, which also presents problems when trying to find a location for a diode.

It would be advantageous to provide a technique that ensures that a location for a protection diode always exists, that the location is close to the buffer and that eliminates the need to use rule checker tools to determine whether a protection diode is needed.

SUMMARY OF THE INVENTION

The present invention provides a method and apparatus for preventing buffers used to reduce delays on long lines of an IC from being damaged due to charge that collects on the buffers due to the capacitance and resistance of the lines. In accordance with the present invention, a protection diode is included directly in at least each buffer that used for this purpose.

Preferably, each buffer on the IC that functions to reduce long-line delays comprises a protection diode so that it is unnecessary to run a rules checker program or the like to determine whether a protection diode is need and, if so, where to place it. However, a rules checker program can be used to determine whether a buffer needs to be protected by a diode. Then, protection diodes could only be included in buffers that need them. Therefore, although the present invention obviates the need for using a rules checker program for this purpose, a rules checker program can be used with the present invention if desired. The present invention also obviates problems associated with trying to determine where to locate a protection diode, assuming that any location can be found for the diode.

These and other features and embodiments of the present invention will be described below with reference to the detailed description, drawings and claims.

DETAILED DESCRIPTION OF THE INVENTION

Figure 1:
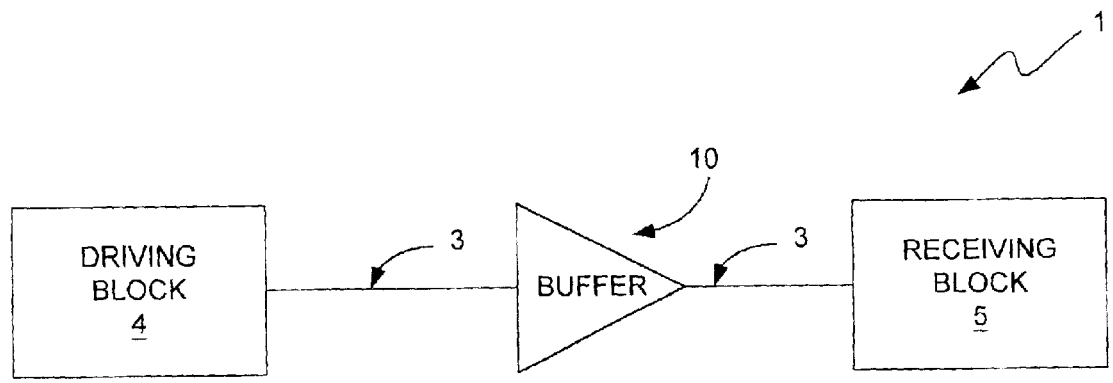
FIG. 1 illustrates a block diagram of a portion of an integrated circuit in which a buffer, or repeater, has been inserted into a long line to reduce delays in signals transmitted from a driving block to a receiving block over the line.

FIG. 1 illustrates a block diagram of a portion 1 of an integrated circuit in which a buffer 10, or repeater, has been included in a long line 3 to reduce delays in signals transmitted from a driving block 4 to a receiving block 5 over the line 3. As stated above, it is known in the art to connect a protection diode to the line 3 at some location between the driving block 4 and the buffer 10 near the buffer 10. As stated above, determining whether a protection diode is needed and the location at which the protection diode should be formed is a task that, until the present invention, needed to be performed in order to protect the buffer. Although rule checker programs enable this task to be computationally performed, thus making the task easier for the designer, the task nevertheless had to be performed as part of the design process. Also, as indicated above, rule checker programs are not always successful at finding a location for a protection diode.

Figure 2:
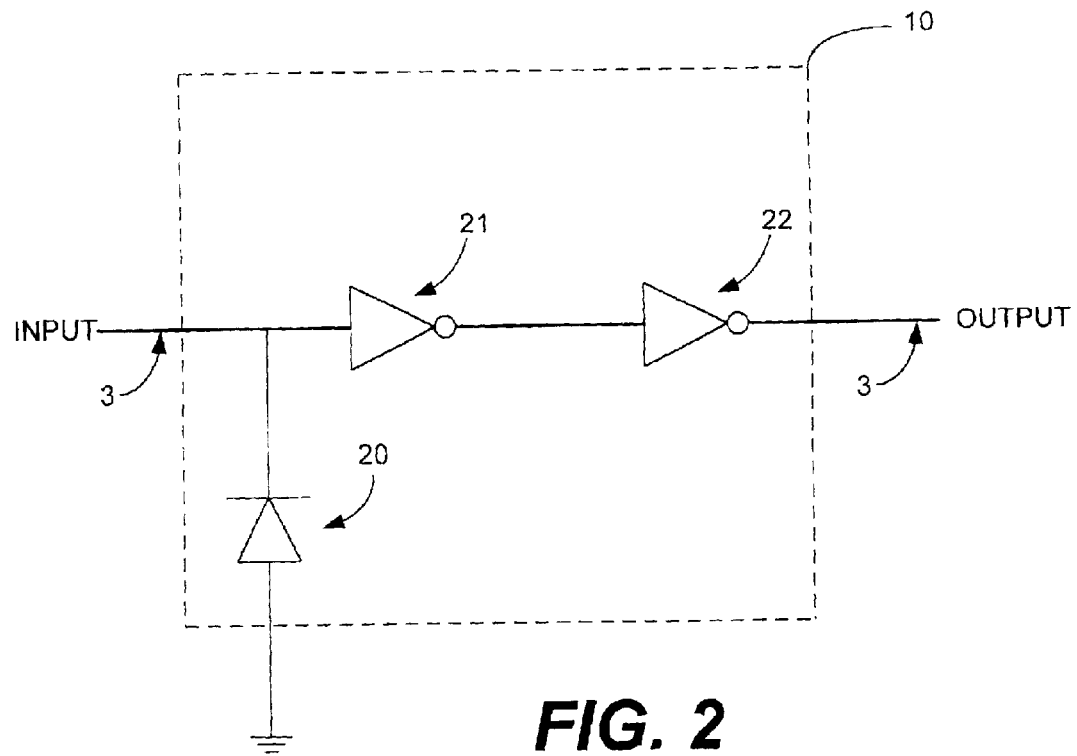
FIG. 2 illustrates a block diagram of the buffer shown in FIG. 1 having a diode therein that collects some of the charge on the line to prevent all of the charge from collecting on the gates of the transistors that are comprised by the buffer.

In accordance with the present invention, the protection diode 20 is comprised in the buffer 10 itself, as shown in FIG. 2. Preferably, each buffer on the IC that functions as a repeater comprises a protection diode so that it is unnecessary to run a rules checker program or the like to determine whether a protection diode is need and, if so, where to place it. However, this does not mean that a rules checker program cannot be used to determine whether a buffer needs to be protected by a diode, and then only fabricate protection diodes in buffers that need them. Either of these techniques can be used in accordance with the present invention.

With reference again to FIG. 2, the first inverter 21 receives the signal on line 3 and inverts it. The second inverter 22 re-inverts the inverted signal back to its original state, i.e., back to the state of the signal prior to being operated on by the buffer 10. The inverters 21 and 22 simply drive the signal on line 3 in order to reduce the delay caused by the combined capacitance and resistance (not shown) of the long line 3. A protection diode 20 is fabricated into the buffer 10 so that it is as close as possible to the buffer 10 and so that a rule checker program, or some other similar tool, is not needed to determine where to locate the diode 20. The diode performs its intended function of pulling charge away from the inverter 21, thereby preventing the FETs (not shown) that make up the inverter 21 from being damaged by too much electrical charge on the line 3.

Figure 3:
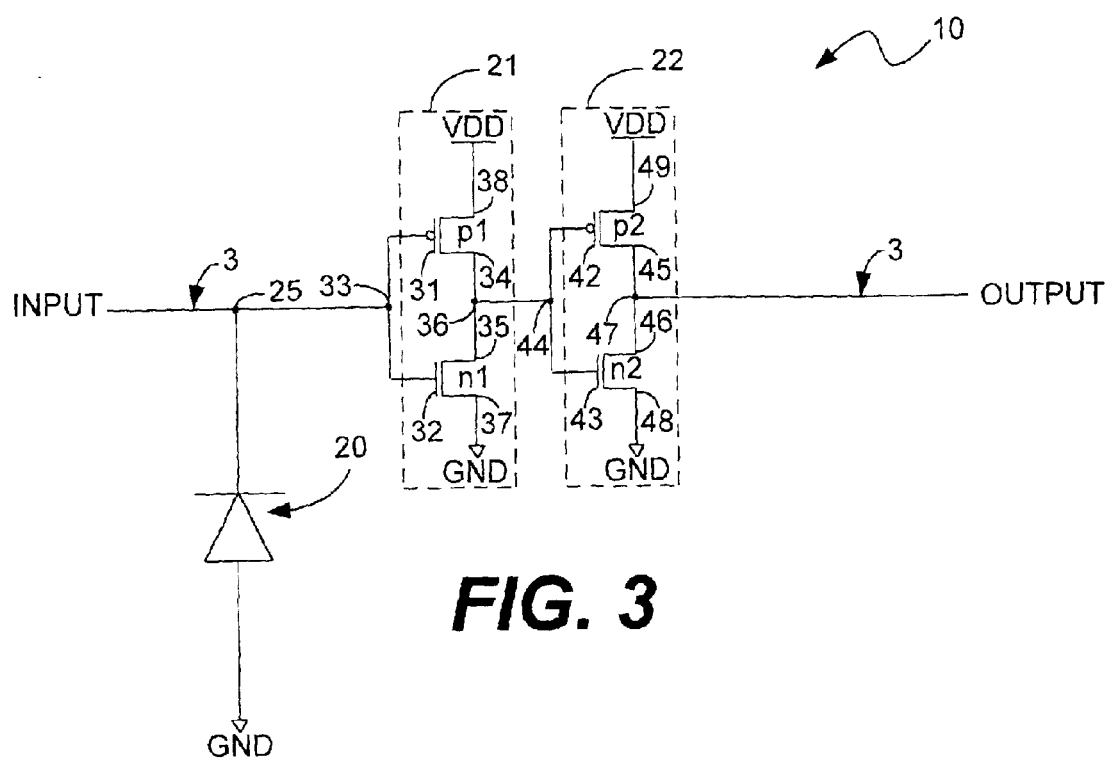
FIG. 3 is a schematic diagram of the buffer shown in FIG. 2.

FIG. 3 is a schematic diagram of the buffer 10 shown in FIG. 2. The diode 20 is connected to the line 3 at node 25 and is connected to ground, as shown. The inverter 21 is comprised of a PFET, p1, and an NFET, n1, which have their gates 31 and 32, respectively, tied together at node 33. The drain 34 of p1 and the source 35 of n1 are connected together at node 36. The NFET n1 has its drain 37 connected to ground and PFET p1 has its source connected to VDD. Node 36 is connected to node 44. The gates 42 and 43 of PFET p2 and NFET n2, respectively, of the inverter 22 are connected together at node 44. The drain 45 of PFET p2 and the source 46 of NFET n2 are tied together at node 47. The drain 48 of NFET n2 is connected to ground and the source of PFET 49 is connected to VDD. Node 47 is the output node of the buffer 10.

The operation of the inverters 21 and 22 is straightforward. When node 33 is low, PFET p1 turns on, pulling node 36 high. When node 33 is high, NFET n1 turns on, pulling node 36 low. When node 36 is low, PFET p2 turns on, pulling node 47 high. When node 36 is high, NFET n2 turns on, pulling node 47 low. Therefore, when the input to the buffer 10 is high, the output to the inverter 21 goes low. When the output of the inverter 21, which is tied to the input of inverter 22 goes low, the output of inverter 22 goes high.

The manner in which a determination can be made as to the size of the protection diode will now be provided. The amount of charge that a metal line collects is proportional to the volume of the metal line and can be calculated as follows:

$$\text{metal\_volume} = \text{metal\_length} * \text{metal\_width} * \text{metal\_thickness} \quad \text{(Eq. 1)}$$

The amount of area of a FET gates of the buffer that is available to store the charge that collects on the gate is proportional to the area of the gate and can be calculated as follows:

$$\text{gate\_area} = \text{gate\_length} * \text{gate\_width} \quad \text{(Eq. 2)}$$

The antenna ratio is equal to the metal volume given by Equation 1 divided by the gate area given by Equation 2, i.e., $$\text{antenna\_ratio} = \text{metal\_volume}/\text{gate\_area} \quad \text{(Eq. 3)}$$

If the antenna ratio given by Equation 3 is less than a particular number, e.g., 2000, no protection diode is needed. The antenna ratio that determines whether or not a protection diode is needed is process-dependent and vendor-dependent. Those skilled in the art understand the manner in which, for a given process, the antenna ratio can be used to determine whether or not a protection diode is needed. If the antenna ratio given by Equation 3 is greater than a particular number, e.g., 2000, a protection diode is needed, and the antenna ratio can be used to determine the size of the diode needed.

For example, assuming that for a given process an antenna ratio that exceeds 2000 indicates that a protection diode is needed, the following equation gives the size of the diode needed. The size is in square microns.

$$\text{diode\_area} = (\text{antenna\_ratio} - 2000)/500 \quad \text{(Eq. 4)}$$

As stated above, it is preferable to include a protection diode in each buffer. However, as shown by Equations 1–4, if desired, a determination can be made as to whether a protection diode is needed and the size of the diode. Then, protection diodes need only be included in buffers that are determined to need them. The size of the protection diode will depend on the size of the FETs of the buffers. The size of the FETs of the buffers is proportional to the driving strength of the buffers and, consequently, to the amount that the delay is reduced in the associated line. Therefore, the size of the diodes will depend on the characteristics of the buffers, which, in turn, depend on other factors, such as the process used to create the IC. Those skilled in the art will understand these relationships and dependencies and the manner in which they should be taken into account.

It should be noted that the present invention has been described with reference to particular embodiments and that the present invention is not limited to the particular embodiments described herein. For example, the logical arrangement of the FETs in the inverters can be altered to achieve the same effects as those described above with reference to FIG. 3. Also, the number of FETs that make up the inverters can be changed. For example, more FETs can be added to increase the drive strength of the inverters, as will be understood by those skilled in the art. The present invention is also process independent and can be applied regardless of the IC process used to create the IC, as will also be understood by those skilled in the art in view of the discussion provided herein. As stated above, the present invention applies equally to other IC processes, such as bipolar junction transistor processes, as well as future IC processes that have not yet been developed. Other modifications may also be made without deviating from the scope of the present invention.

What is claimed is:

1. An integrated circuit (IC) comprising:
    a buffer for reducing delays on relatively long conductive signal lines of the IC, the buffer comprising:
        a first inverter having an input connected to one of said conductive signal lines of an IC that comprises the buffer;
        a second inverter having an input connected to an output of the first inverter; and
        a protection diode connected to the input of the first inverter, the protection diode pulling at least some electrical charge off at least one gate of at least one transistor of the first inverter to prevent the buffer from being damaged by too much electrical charge collecting on the transistor gate.

2. The IC of claim 1, wherein the size of the protection diode in terms of area is at least partially dependent on the area of the transistor gate.

3. The IC of claim 1, wherein the first and second inverters each comprise a P field effect transistor (PFET) and an N field effect transistors (NFETs).

4. The IC of claim 1, wherein each inverter comprises at least first bipolar junction transistor (BJT).

5. The IC of claim 1, wherein the size of the protection diode in terms of area is at least partially dependent on dimensions of the conductive signal line to which the input of the first inverter is connected.

6. The IC of claim 1, wherein the size of the protection diode in terms of area is dependent on dimensions of the conductive signal line to which the input of the first inverter is connected and on the gate area of said transistor gate of the first inverter.

7. The IC of claim 1, wherein the size of the protection diode in terms of area depends at least partially on the IC process used to design the IC.

8. A method for preventing buffers used to reduce delays on relatively long conductive signal lines of an IC from being damaged due to electrical charges that collect on the buffers during manufacturing of the IC, the method comprising the steps of:

buffering at least one conductive signal line of an IC with a buffer to reduce delays in the conductive signal line, said buffer comprising first and second inverters, the first and second inverters, the buffer comprising a protection diode, the protection diode being connected to an input of the first inverter, the protection diode pulling at least some of the electrical charge off of at least one gate of at least one transistor of the first inverter to prevent the buffer from being damaged by too much electrical charge collecting on said transistor gate, the buffer and the protection diode being formed on the IC.

9. The method of claim 8, wherein the buffering step includes buffering multiple conductive signal lines of the IC with buffers, and wherein every buffer of the IC comprises first and second inverters and a protection diode connected to an input of the first inverter.

10. The method of claim 8, further comprising the step of determining whether a buffer needs a protection diode prior to buffering one of said conductive signal lines with a buffer that includes a protection diode.

11. The method of claim 8, wherein the size of the protection diode in terms of area is at least partially dependent on the gate area of said transistor.

12. The method of claim 8, wherein the size of the protection diode in terms of area is preselected.

13. The method of claim 8, wherein the IC is manufactured using a bipolar junction transistor process technology.

14. The method of claim 8, wherein the IC is manufactured using field effect transistor process technology.

15. The method of claim 8, wherein the size of the protection diode in terms of area is at least partially dependent on dimensions of the conductive signal.

16. The method of claim 8, wherein the size of the protection diode in terms of area is dependent on dimensions of the conductive signal line to which the buffer input is connected and on the gate area of said transistor.

17. The method of claim 8, wherein the size for the protection diode in terms of area depends at least partially on the IC process used to design the IC.

18. The method of claim 11, wherein the size for the protection diode in terms of area is preselected.

19. A method for use in designing an integrated circuit (IC) comprising:

inserting buffer cells into an IC design such that respective inputs of the respective buffer cells are connected to conductive signal lines of the IC design for reducing delays on the conductive signal lines, each buffer cell comprising:

first and second inverters, the first and second inverters each having at least a non-inverting transistor and an inverting transistor with gates electrically coupled together, an output of the first inverter being connected to an input of the second inverter; and a protection diode connected to an input of the first inverter inside of the IC.

* * * * *